United States Patent
Hu et al.

(10) Patent No.: US 10,285,260 B2
(45) Date of Patent: May 7, 2019

(54) FLEXIBLE PRINTED CIRCUIT BOARD AND METHOD FOR MANUFACTURING SAME

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Xian-Qin Hu, Qinhuangdao (CN); Yan-Lu Li, Qinhuangdao (CN); Li-Bo Zhang, Qinhuangdao (CN)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 14/927,888

(22) Filed: Oct. 30, 2015

(65) Prior Publication Data
US 2016/0150635 A1    May 26, 2016

(30) Foreign Application Priority Data
Nov. 21, 2014    (CN) .......................... 2014 1 0671700

(51) Int. Cl.
*H05K 3/42*    (2006.01)
*H05K 1/02*    (2006.01)
(Continued)

(52) U.S. Cl.
CPC ......... *H05K 1/0251* (2013.01); *H05K 3/4623* (2013.01); *H05K 3/4688* (2013.01);
(Continued)

(58) Field of Classification Search
CPC .... H05K 1/0251; H05K 1/115; H05K 3/4623; H05K 3/4688; H05K 3/4015;
(Continued)

(56) References Cited

U.S. PATENT DOCUMENTS 5,319,159 A *    6/1994    Watanabe ............. H05K 1/113
                                                    174/262
6,591,495 B2 *    7/2003    Hirose ................. H05K 3/0035
                                                    174/264
(Continued)

FOREIGN PATENT DOCUMENTS

TW    201440590 A    10/2014

*Primary Examiner* — A. Dexter Tugbang
*Assistant Examiner* — Kaying Kue
(74) *Attorney, Agent, or Firm* — ScienBiziP, P.C.

(57) ABSTRACT

The flexible printed circuit board includes a base layer, a first circuit layer and a second circuit layer, the first circuit and the second circuit layer formed on both sides of the base layer; conducting holes extending through the base layer and the first copper layer, the conducting holes include annular copper ring embedded in the first circuit layer. A height difference between a surface of the annular copper ring and a surface of the first circuit layer is in a range from 0 to 3 micrometers. A method for manufacturing the flexible printed circuit board is also provided.

3 Claims, 10 Drawing Sheets

(51) Int. Cl.
  *H05K 3/46*  (2006.01)
  *H05K 1/11*  (2006.01)
  *H05K 3/40*  (2006.01)

(52) U.S. Cl.
  CPC ............ *H05K 1/115* (2013.01); *H05K 3/4015* (2013.01); *H05K 2201/09063* (2013.01); *H05K 2201/09472* (2013.01); *H05K 2201/09845* (2013.01); *H05K 2201/10303* (2013.01); *H05K 2203/061* (2013.01)

(58) Field of Classification Search
  CPC ...... H05K 3/4038–3/4084; H05K 3/42–3/429; H05K 2201/09063; H05K 2201/09472; H05K 2201/09845; H05K 2201/10303; H05K 2203/061; Y10T 29/49165; Y10T 29/49156
  USPC .................................. 29/852, 853, 846–851
  See application file for complete search history.

(56) References Cited

U.S. PATENT DOCUMENTS

| | | | |
|---|---|---|---|
| 6,684,497 B2 * | 2/2004 | Appelt | H05K 3/06 29/830 |
| 6,912,779 B2 * | 7/2005 | Naitoh | H05K 3/423 29/846 |
| 7,169,313 B2 * | 1/2007 | Card | H05K 3/108 216/13 |
| 7,240,430 B2 * | 7/2007 | Appelt | H05K 3/06 29/830 |
| 7,681,310 B2 * | 3/2010 | Chinda | H05K 3/421 156/247 |
| 7,827,680 B2 * | 11/2010 | En | C23C 18/1607 204/230.6 |
| 2004/0134682 A1 * | 7/2004 | En | C23C 18/1607 174/258 |
| 2004/0136152 A1 * | 7/2004 | Mitsuhashi | H05K 3/4602 174/262 |
| 2005/0097735 A1 * | 5/2005 | Kanda | H05K 3/388 29/829 |
| 2006/0054588 A1 * | 3/2006 | Hsu | H05K 3/381 216/13 |
| 2006/0255009 A1 * | 11/2006 | Card | H05K 3/108 216/13 |
| 2007/0148355 A1 * | 6/2007 | Meagher | C23G 1/08 427/299 |
| 2008/0302468 A1 | 12/2008 | Sidhu | |
| 2008/0314632 A1 * | 12/2008 | Wu | H05K 1/115 174/263 |
| 2009/0283315 A1 * | 11/2009 | Lee | H05K 3/421 174/262 |
| 2012/0103667 A1 * | 5/2012 | Ito | H01L 21/486 174/257 |
| 2012/0181666 A1 * | 7/2012 | Takahashi | B41J 2/1612 257/618 |

* cited by examiner

FLEXIBLE PRINTED CIRCUIT BOARD AND METHOD FOR MANUFACTURING SAME

FIELD

The subject matter herein generally relates to a flexible printed circuit board and a method for manufacturing the flexible printed circuit board.

BACKGROUND

Conducting lines of a flexible circuit board are becoming precise and fine. Normally, fine lines are formed by selective copper plating process. However annular rings formed by selective plating are formed above a circuit layer, thus a step exists at the annular ring. The step is usually more than 10 microns (UM), and the higher the number of the circuit layers is, the larger the step is, thereby restricting the production of fine lines.

DETAILED DESCRIPTION

Figure 1:
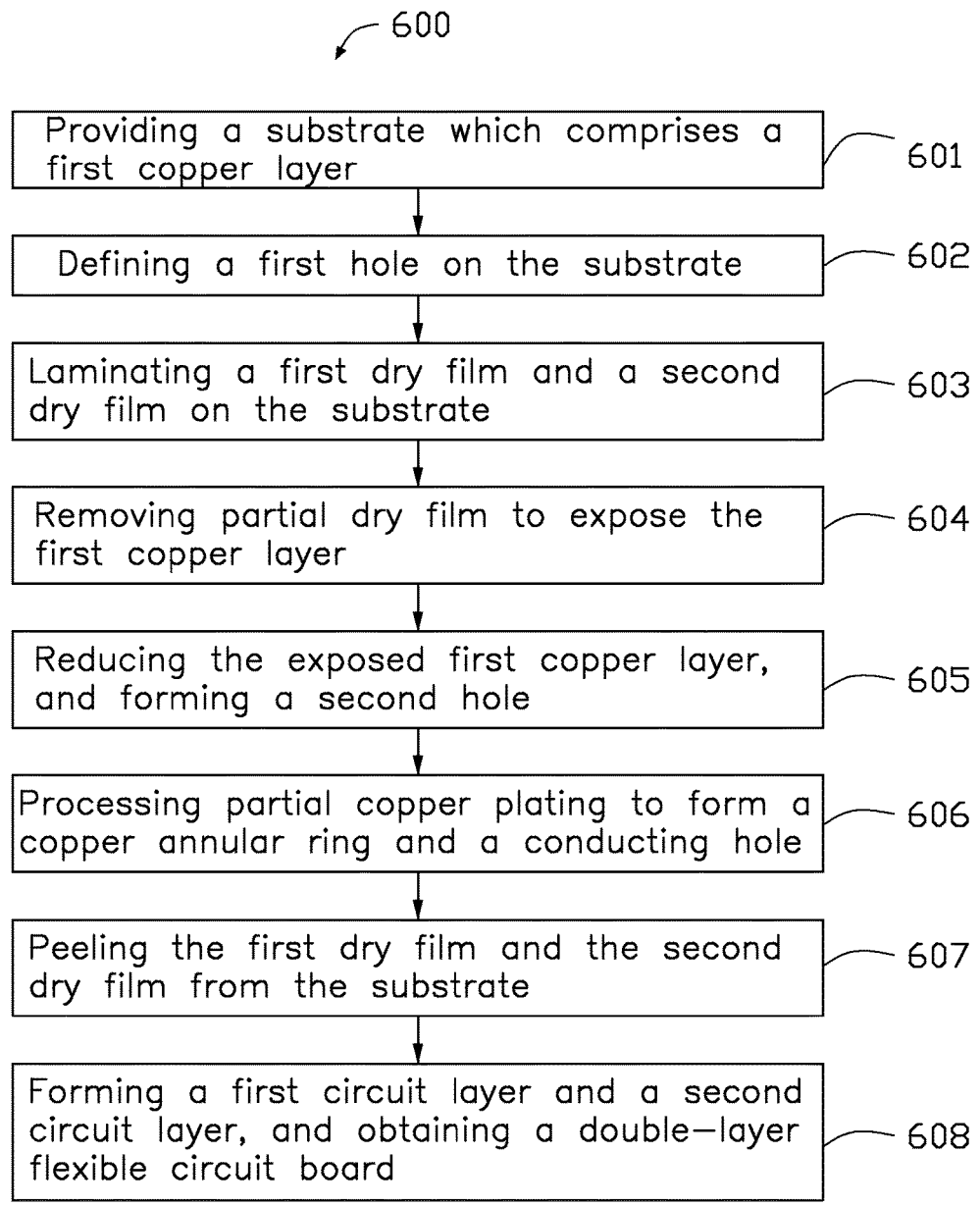
FIG. 1 is a flowchart showing a method for forming a double-layer flexible circuit board in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series and the like. The references "a plurality of" and "a number of" mean "at least two."

FIG. 1 is a flowchart presented in accordance with an example embodiment. The example method 600 for making a double-layer flexible circuit board 300 (shown in FIG. 8) is provided by way of an example, as there are a variety of ways to carry out the method. The method 600 described below can be carried out using the configurations illustrated in FIGS. 2 to 9, for example, and various elements of these figures are referenced in explaining example method 600. Each block shown in FIG. 1 represents one or more processes, methods or subroutines, carried out in the exemplary method 600. Additionally, the illustrated order of blocks is by example only and the order of the blocks can change according to the present disclosure. The exemplary method 600 can begin at block 601.

Figure 2:
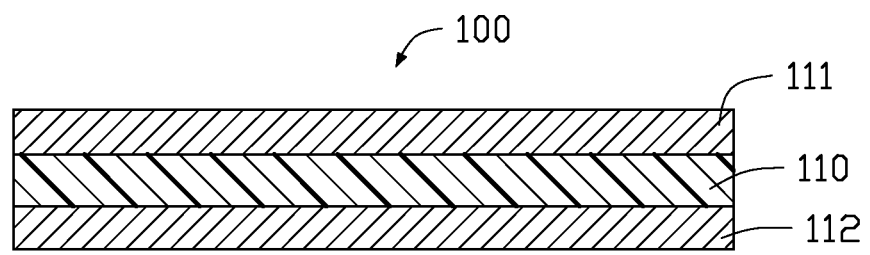
FIG. 2 is a cross sectional view of a substrate of a first embodiment of the present disclosure.

At block 601, also referring FIG. 2, a substrate 100 is provided. FIG. 2 illustrates that the substrate 100 is a double-sided board. The substrate 100 includes a base layer 110, a first copper layer 111, and a second copper layer 112. The first copper layer 111 is formed at one side of the base layer 110, and the second copper layer 112 is formed at an opposite side of the base layer 110.

In the illustrated embodiment, the base layer 110 is a flexible resin layer made of flexible resin, such as Polyimide (PI), Polyethylene Terephthalate (PET), or Polyethylene Naphthalate (PEN).

Figure 3:
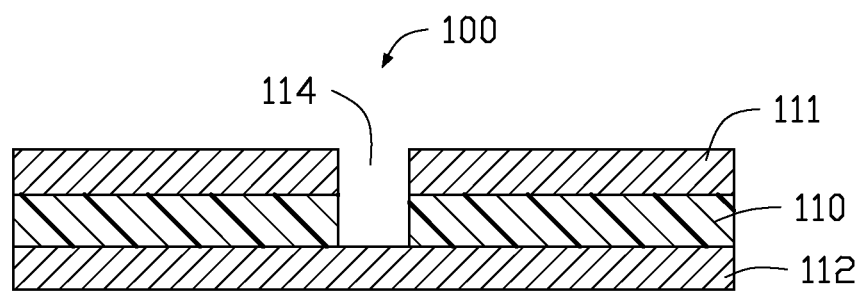
FIG. 3 is a cross sectional view similar to FIG. 2, but with a first hole defined.

At block 602, also referring FIG. 3, a first hole 114 is defined in the substrate 100.

FIG. 3 illustrates that the first hole 114 is a blind hole. The first hole 114 extends through the first copper layer 111 and the base layer 110, and terminates at the second copper layer 112. The first hole 114 is formed by laser processing.

Figure 4:
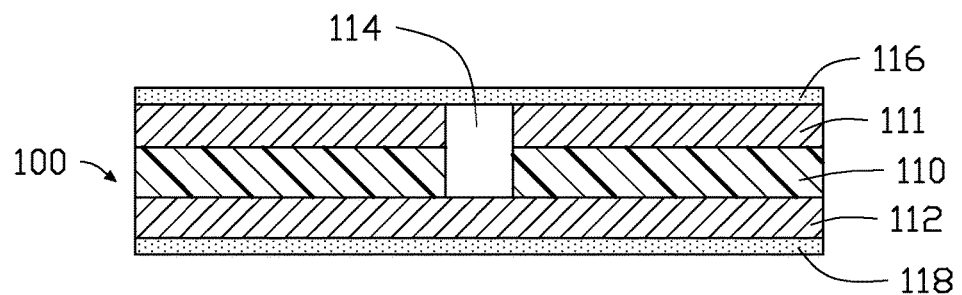
FIG. 4 is a cross sectional view illustrating that the substrates of FIG. 3 are covered by dry films.

At block 603, FIG. 4 illustrates a first dry film 116 and a second dry film 118 are laminated on the substrate 100 after the substrate 100 receives shadows or organic conducting coating treatment. FIG. 4 illustrates that the first dry film 116 is covered on the first copper layer 111, and the second dry film 118 is covered on the second copper layer 112.

Figure 5:
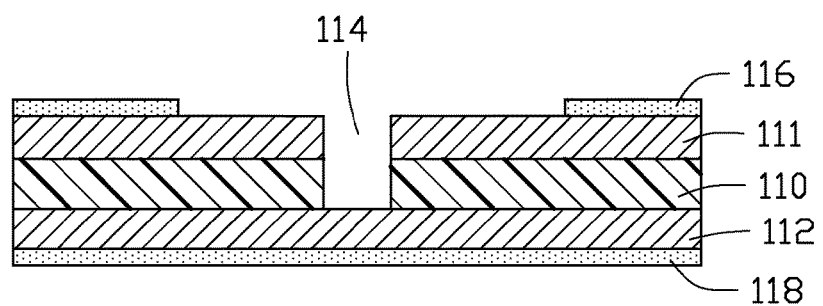
FIG. 5 is a cross sectional view similar to FIG. 4, but with parts of the dry films removed.

At block 604, FIG. 5 illustrates a part of the dry film 116 at the opening of the first hole 114 is removed to expose part of the first copper layer 111. FIG. 5 illustrates that the dry film 116 is removed by exposure and developing. The opening of the first hole 114 is only defined on the first dry film 116, hence, only part of the first dry film 116 needs to be removed to expose the first copper layer 111. The first hole 114 is surrounded by the exposed first copper layer 111 to form a ring.

Figure 6:
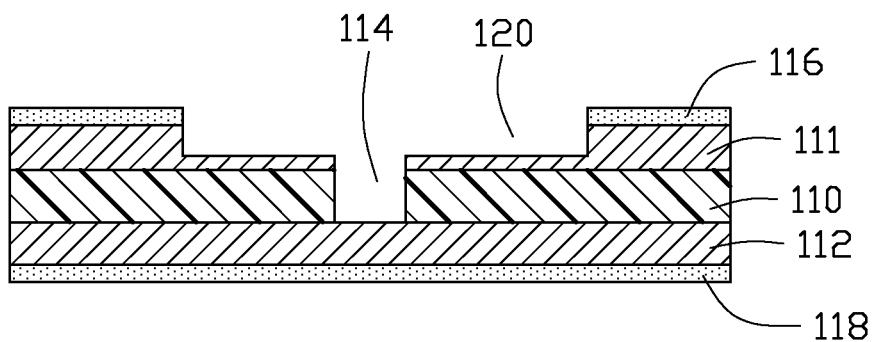
FIG. 6 is a cross sectional view similar to FIG. 5, but with a copper layer of the substrate reduced.

At block 605, also referring FIG. 6, the exposed first copper layer 111 is reduced, and a second hole 120 is formed on the copper layer 111.

FIG. 6 illustrates that the second hole 120 is communicating with the first hole 114. In the illustrated embodiment, the reduction step is only performed to the exposed part of the first copper layer 111. The diameter of the second hole 120 is larger than the first hole 114. The first hole 114 and the second hole 120 collectively form a step hole. A thickness of the reduced copper can be adjusted according to a thickness of the first copper layer 111 and a thickness of the subsequent plating copper. In the process of copper reduction, the exposed first copper layer 111 may not be completely removed, but needs to keep a thickness of at least 2 to 4 microns.

The copper reduction step can be implemented by chemical etching. In addition, the bottom of the first hole 114 is also exposed in corrosive liquid during the copper reduction step, so part of the second copper layer 112, which is exposed to the first hole 114, is also reduced by corrosion, the thickness of removed part is about 1 to 3 microns.

Figure 7:
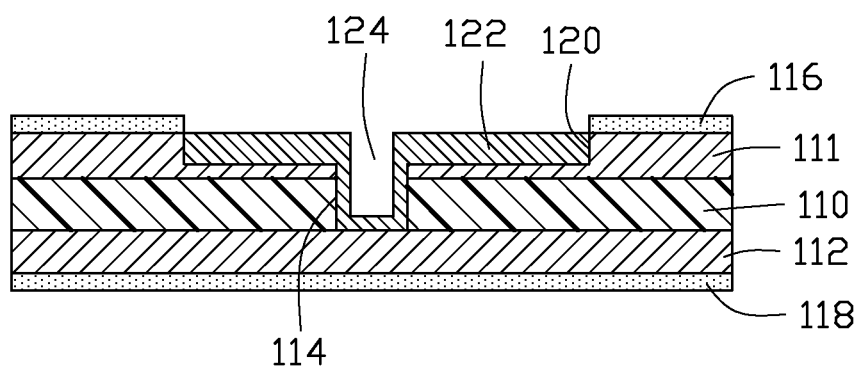
FIG. 7 is a cross sectional view similar to FIG. 6, but with an annular ring formed.

At block 606, also referring FIG. 7, partial copper plating is processed in the first hole 114 and the second hole 120 to form an annular copper ring 122 and a conducting hole 124.

FIG. 7 illustrates that the conducting hole 124 is a blind hole. The annular copper ring 122 is formed at the bottom of the first hole 114, and on the wall of the first hole 114 and second hole 120. The height difference between the annular copper ring 122 and the first copper layer 111 (step) is in a range of 0-3 micrometers. In comparison, the height of a conventional step is bigger than 10 microns. Thus, the present disclosure can reduce the height of the step, which increases smoothness of panel surface, and increases product yield.

Figure 8:
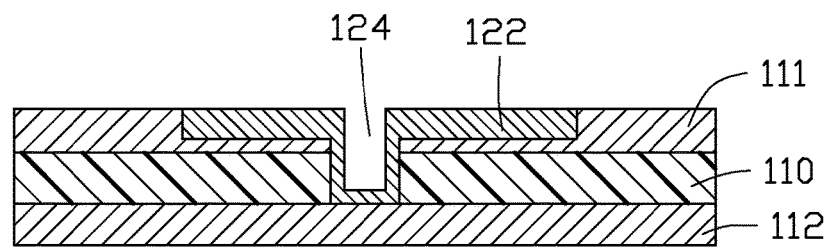
FIG. 8 is a cross sectional view similar to FIG. 7, but with the dry films removed.

At block 607, the first film 116 and the second film 118 are peeled from the substrate 100 in FIG. 8.

Figure 9:
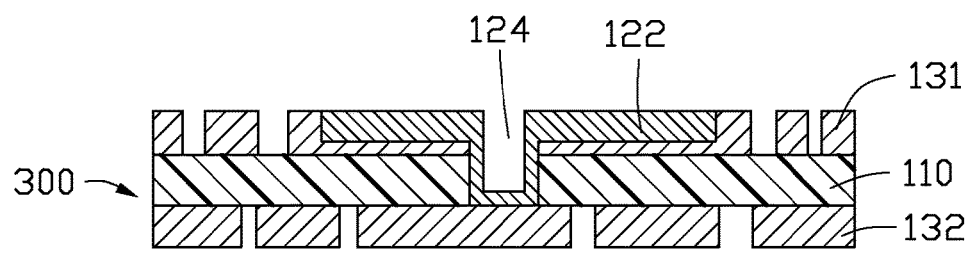
FIG. 9 is a cross sectional view that illustrates circuits formed on the substrate of FIG. 8.

At block 608, FIG. 9 illustrates the first copper layer 111 and the second copper layer 112 are processed to form a first circuit layer 131 and a second circuit layer 132, and a double-layer flexible circuit board 300 is obtained.

In the illustrated embodiment, the double-layer flexible circuit board 300 receives dry film lamination, exposure, development, etching, faded film, and automatic optical inspection processes. Because the procedure is well known to persons skilled in the art, it is not described here.

Due to the flatness of the surface of the first copper layer 111 and the second copper layer 112, a higher resolution thin dry film can be selected and the thin dry film can be dry-pressed, which helps to reduce disconnection of lines, and higher dry film resolution also contributes to the making of precision lines.

FIG. 9 illustrates in this embodiment a double-layer flexible circuit board is provided; the double-layer flexible circuit board includes a base layer 110, a first circuit layer 131 and a second circuit layer 132. The first circuit layer 131 and the second circuit layer 132 are formed on both sides of the base layer 110. The flexible circuit board also includes a conducting hole 124. The conducting hole 124 extends through the first circuit layer 131 and the base layer 110. The conducting hole 124 includes an annular copper ring 122 which is embedded in the first circuit layer 131. A height difference between the surface of the annular copper ring 122 and the surface of the first circuit layer 131 is in a range of 0-3 micrometers.

Figure 10:
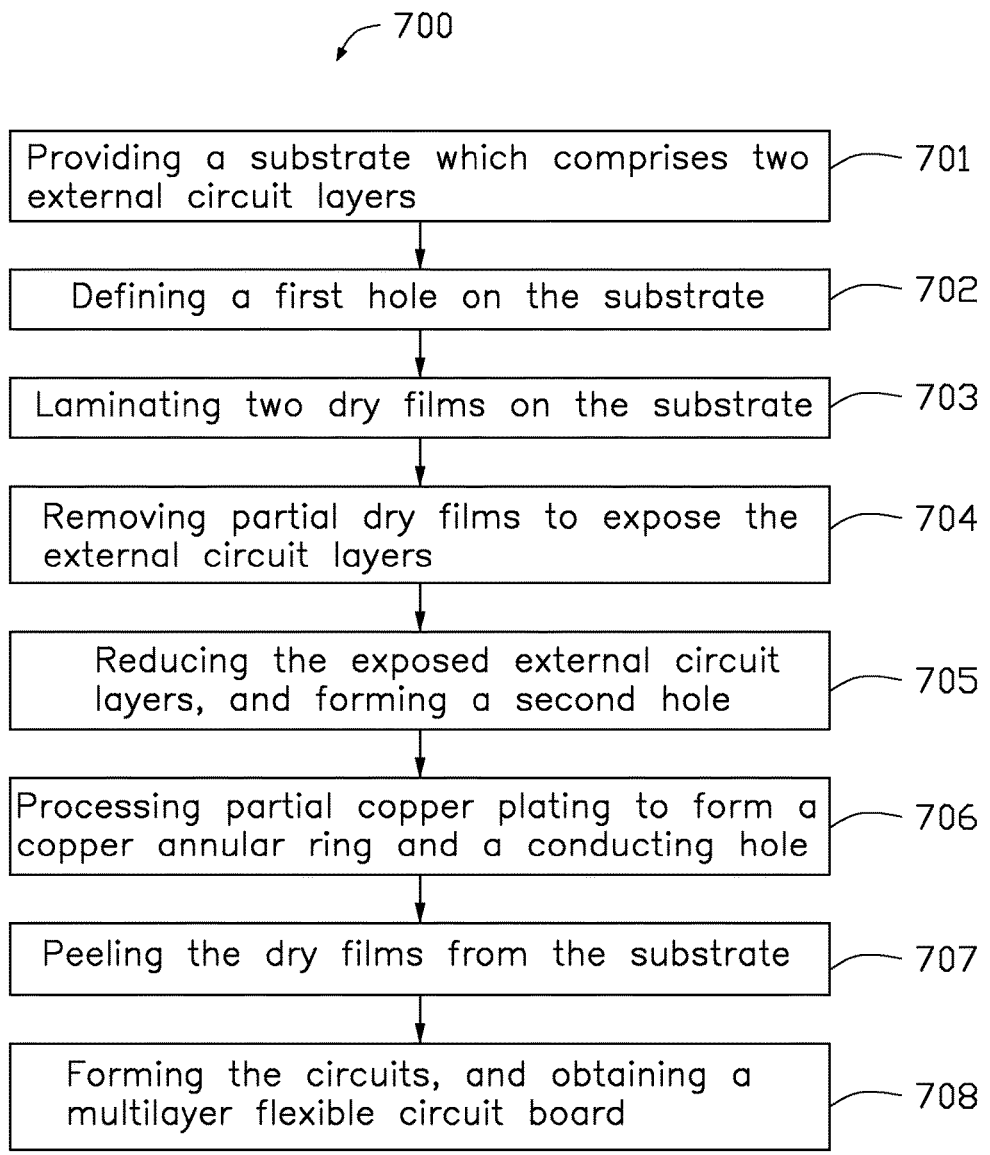
FIG. 10 is a flowchart showing a method for forming a multilayer flexible circuit board in accordance with another embodiment of the present disclosure.

FIG. 10 shows a flowchart presented in accordance with another example embodiment. The example method 700 for making a multilayer flexible circuit board 400 (shown in FIG. 18) is provided by way of an example, as there are a variety of ways to carry out the method. The method 700 described below can be carried out using the configurations illustrated in FIGS. 11 to 18, for example, and various elements of these figures are referenced in explaining example method 700. Each block shown in FIG. 10 represents one or more processes, methods or subroutines, carried out in the exemplary method 700. Additionally, the illustrated order of blocks is by example only and the order of the blocks can change according to the present disclosure. The exemplary method 700 can begin at block 701.

Figure 11:
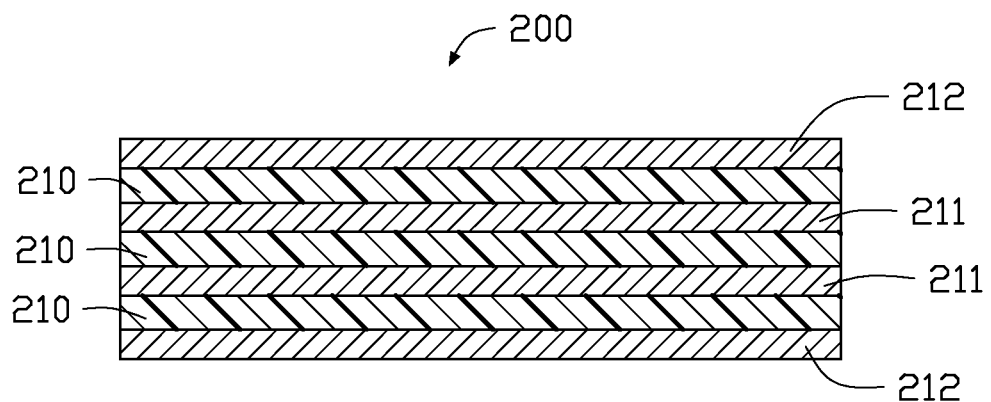
FIG. 11 is a cross sectional view of a substrate of the second embodiment of the present disclosure.

At block 701, FIG. 11 illustrates a substrate 200 is provided.

In the illustrated embodiment, the substrate 200 is a multi layer board. The substrate 200 includes a plurality of base layers 210, a plurality of internal circuit layers 211, and two external circuit layers 212, superimposed in turn. The two external circuit layers 212 are formed on the two outermost base layers 210. The two external circuit layers 212 are the uppermost and lowest layer of the substrate 200.

In the illustrated embodiment, the base layer 210 is a flexible resin layer made of flexible resin, such as Polyimide (PI), Polyethylene Terephthalate (PET), or Polyethylene Naphthalate (PEN).

Figure 12:
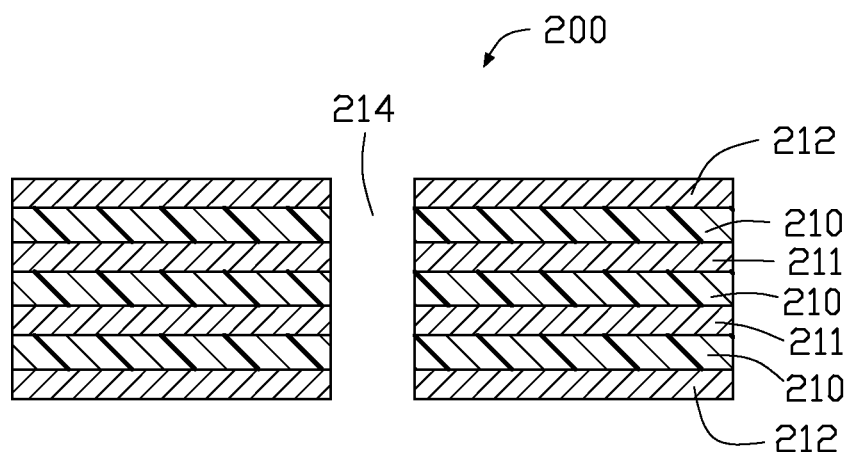
FIG. 12 is a cross sectional view similar to FIG. 11, but with a first hole defined.

At block 702, referring to FIG. 12, a first hole 214 is defined on the substrate 200. In the illustrated embodiment, the first hole 114 is a through hole, extending through all of the external circuit layers 212, the base layer 210, and the internal circuits 211. The first hole 214 is formed by machining.

Figure 13:
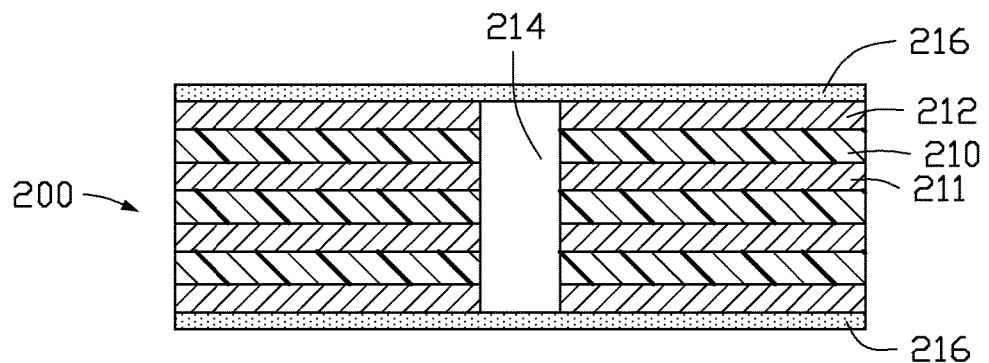
FIG. 13 is a cross sectional view illustrating that the substrates of FIG. 12 are covered by dry films.

At block 703, FIG. 13 illustrates two dry films 216 are laminated on the substrate 200 after receiving shadows or organic conducting coating treatment on the substrate 200. In the illustrated embodiment, the dry films 216 are covered on the two external circuit layers 212 respectively.

Figure 14:
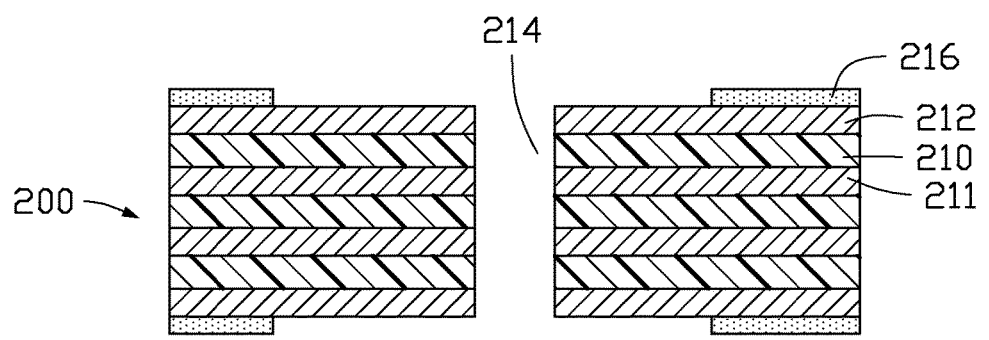
FIG. 14 is a cross sectional view similar to FIG. 13, but with parts of the dry films removed.

At block 704, FIG. 14 illustrates a part of the dry films 216 at the openings of the first hole 214 are removed to expose part of the external circuit layers 212. In the illustrated embodiment, the dry films are removed by exposure and developing. The first hole 214 is a through hole. Hence, the two films 216 need to be removed to expose the external circuit layers 212. The first hole 214 is surrounded by the exposed external circuit layers 212, the exposed external circuit layers 212 are presented with a ring shape.

Figure 15:
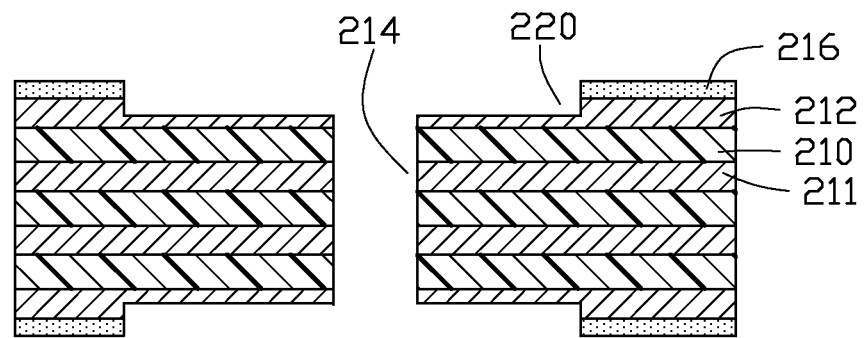
FIG. 15 is a cross sectional view similar to FIG. 14, but with a copper layer of the substrate reduced.

At block 705, FIG. 15 illustrates the exposed external circuit layers 212 are reduced, and a second hole 220 is formed on the external circuit layers 212, the second hole 220 is communicating with the first hole 214. In this embodiment, a total of two second holes 220 are defined. The diameter of the second hole 220 is larger than the first hole 214. As a whole, the first hole 214 and the second hole 220 form an I-shaped hole together. The thickness of the reduced copper can be adjusted according to the thickness of the external circuit layers 212 and the thickness of the subsequent plating copper. In the process of copper reduction, the exposed the external circuit layers 212 may not be completely removed, but need to keep the thickness of the remaining part at least 2 to 4 microns.

The copper reduction step can be implemented by chemical etching.

Figure 16:
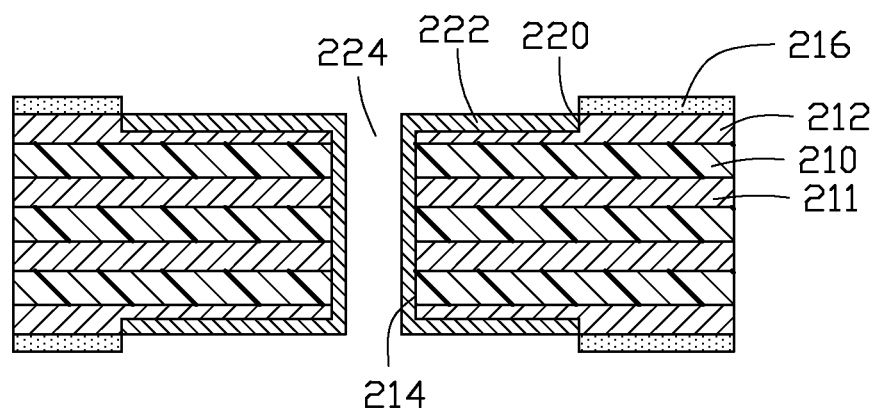
FIG. 16 is a cross sectional view similar to FIG. 15, but with an annular ring formed.

At block 706, FIG. 16 illustrates partial copper plating is processed in the first hole 214 and second hole 220 to form annular copper rings 222, and a conducting hole 224. In the illustrated embodiment, the conducting hole 224 is a through hole. The annular copper rings 222 are formed on the wall of the first hole 214 and second hole 220. The height difference between the annular copper rings 222 and external circuit layers 212 (step) is in the range of 0-3 micrometers. In comparison, the height of a conventional step is bigger than 10 microns. Thus, the present disclosure can reduce the height of the step, which increases smoothness of panel surface, and increases product yield.

Figure 17:
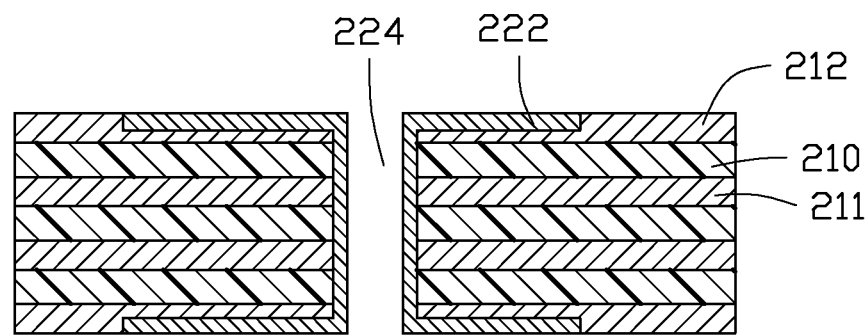
FIG. 17 is a cross sectional view similar to FIG. 16, but with the substrate removed.

At block 707, FIG. 17 illustrates the dry films 216 are peeled from the substrate 200.

Figure 18:
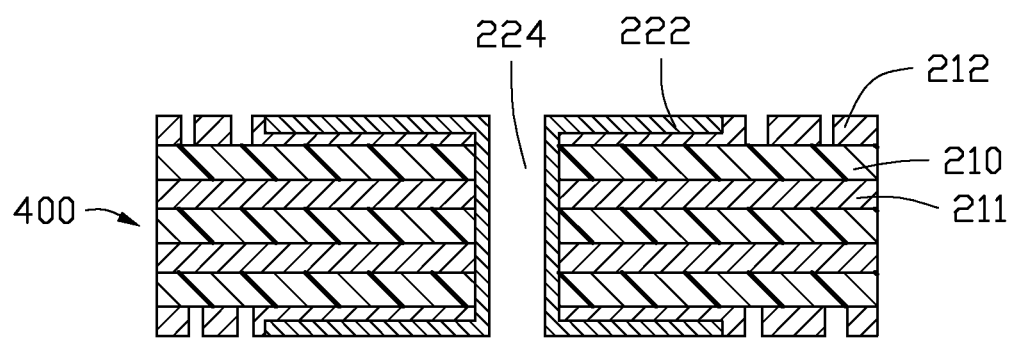
FIG. 18 is a cross sectional view that illustrates circuits formed on the substrate of FIG. 17.

At block 708, FIG. 18 illustrates the multilayer flexible circuit board 400 is obtained, the circuits are formed on the external circuit layers 212. In the illustrated embodiment, the multilayer flexible circuit board is achieved through dry film lamination, exposure, development, etching, faded film, and automatic optical inspection processes.

FIG. 18 illustrates in this embodiment a multilayer flexible circuit board 400 is provided, the multilayer flexible circuit board 400 includes a plurality of base layers 210, a plurality of internal circuit layers 211 and two external circuit layers 212, the two external circuit layers 212 are formed on the outermost sides of the flexible circuit board. The flexible circuit board also includes conducting holes 224, the conducting holes 224 extend through the base layer 210, the internal circuit layers 211, and the two external circuit layers 212. The conducting hole 224 includes annular copper ring 222 which is embedded in the two external circuit layers 212. The height difference between the surface of the annular copper ring 222 and the surface of the two external circuit layers 212 is at the range of 0 to 3 micrometers.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method for manufacturing a flexible printed circuit board, comprising:
   providing a substrate comprising a base layer, a first copper layer and a second copper layer, the first copper formed at one side of the base layer, and the second copper layer formed at an opposite side of the base layer;
   forming a first hole extending through the base layer and the first copper layer, a bottom of the first hole sealed by the second copper layer;
   posting dry films on the first copper layer and the second copper layer;
   removing part of the dry films which corresponding to the part of the first hole on the first copper layer, to expose part of the first copper layer, wherein the first hole is surrounded by the exposed first copper layer and presented with a ring shape;
   reducing a thickness of the copper of the exposed first copper layer to form a second hole on the first copper layer, which is communicated with the first hole;
   partial plating copper at the first and the second hole to form an annular copper ring and a conducting hole, the plated copper of the conducting hole directly contacting a surface of the second copper layer facing the base layer, a surface of the annular copper ring being at a same level with a surface of the first copper layer; and
   removing the dry films, and processing the first copper layer to form a circuit layer, to form the flexible printed circuit board.

2. The method of claim 1, wherein a height difference between the surface of the annular copper ring and the surface of the first copper layer is in the range from 0 to 3 micrometers.

3. The method of claim 1, further comprising: receiving shadows or organic conducting coating treatment procedure before posting the dry films.

* * * * *